(12) United States Patent
Shajii et al.

(10) Patent No.: US 7,072,743 B2
(45) Date of Patent: Jul. 4, 2006

(54) SEMICONDUCTOR MANUFACTURING GAS FLOW DIVIDER SYSTEM AND METHOD

(75) Inventors: Ali Shajii, Canton, MA (US); Siddharth P. Nagarkatti, Acton, MA (US)

(73) Assignee: MKS Instruments, Inc., Wilmington, MA (US)

( * ) Notice: Subject to any disclaimer, the term of this patent is extended or adjusted under 35 U.S.C. 154(b) by 311 days.

(21) Appl. No.: 10/796,693

(22) Filed: Mar. 9, 2004

(65) Prior Publication Data

US 2005/0199342 A1 Sep. 15, 2005

(51) Int. Cl.
G05D 7/00 (2006.01)
G05D 11/00 (2006.01)

(52) U.S. Cl. ............ 700/282; 700/121; 137/101; 702/45

(58) Field of Classification Search ............ 700/95, 700/117, 121, 281, 275, 282, 285; 438/5; 137/9, 101; 702/45
See application file for complete search history.

(56) References Cited

U.S. PATENT DOCUMENTS

| | | | |
|---|---|---|---|
| 4,369,031 A | 1/1983 | Goldman et al. ............ 432/198 |
| 5,040,470 A * | 8/1991 | Lofton et al. ............ 110/234 |
| 5,289,678 A * | 3/1994 | Grutter ............ 60/277 |
| 5,387,309 A | 2/1995 | Bobel et al. ............ 117/85 |
| 5,453,124 A | 9/1995 | Moslehi et al. ............ 118/715 |
| 5,624,498 A | 4/1997 | Lee et al. ............ 118/715 |
| 5,719,495 A * | 2/1998 | Moslehi ............ 324/158.1 |
| 5,976,261 A | 11/1999 | Moslehi et al. ............ 118/719 |
| 6,113,733 A | 9/2000 | Eriguchi et al. ............ 156/345 |
| 6,117,348 A | 9/2000 | Peng et al. ............ 216/60 |
| 6,251,187 B1 | 6/2001 | Li et al. ............ 118/715 |
| 6,278,809 B1 | 8/2001 | Johnson et al. ............ 385/12 |
| 6,302,964 B1 | 10/2001 | Umotoy et al. ............ 118/715 |
| 6,333,272 B1 | 12/2001 | McMillin et al. ............ 438/710 |
| 6,418,954 B1 | 7/2002 | Taylor et al. ............ 137/9 |
| 6,563,578 B1 | 5/2003 | Halliyal et al. ............ 356/237.4 |
| 6,633,391 B1 | 10/2003 | Oluseyi et al. ............ 356/630 |
| 6,676,760 B1 | 1/2004 | Kholodenko et al. ............ 118/728 |
| 6,813,534 B1 * | 11/2004 | Sui et al. ............ 700/121 |
| 6,829,056 B1 * | 12/2004 | Barnes et al. ............ 356/625 |

* cited by examiner

*Primary Examiner*—Jayprakash N. Gandhi
(74) *Attorney, Agent, or Firm*—McDermott Will & Emery LLP

(57) ABSTRACT

A system for dividing a single flow into two or more secondary flows of desired ratios, including an inlet adapted to receive the single flow, at least two secondary flow lines connected to the inlet, an input device adapted to receive at least one desired ratio of flow, at least one in-situ process monitor providing measurements of products produced by each of the flows lines, and a controller connected to the input device and the in-situ process monitor. The controller is programmed to receive the desired ratio of flow through the input device, receive the product measurements from the in-situ process monitor, and calculate a corrected ratio of flow based upon the desired ratio of flow and the product measurements. If the product measurements are not equal, then the corrected ratio of flow will be different than the desired ratio of flow.

31 Claims, 3 Drawing Sheets

SEMICONDUCTOR MANUFACTURING GAS FLOW DIVIDER SYSTEM AND METHOD

FIELD OF THE DISCLOSURE

The present disclosure relates generally to semiconductor manufacturing equipment and, more particularly, to systems and methods for delivering precisely portioned quantities of process gases to semiconductor process chambers. Even more particularly, the present disclosure relates to a system and method for dividing a single flow of process gases into a desired ratio of two or more flows, wherein an in-situ process monitor is used to provide real-time monitoring of processing results produced by each flow and, if the processing results produced by each flow are not equal, then the system and method adjust the ratio of the flows in real time to obtain the desired processing results.

BACKGROUND OF THE DISCLOSURE

The manufacture or fabrication of semiconductor devices often requires the careful synchronization and precisely measured delivery of as many as a dozen gases to a process chamber. Various recipes are used in the manufacturing process, and many discrete processing steps, where a semiconductor device is cleaned, polished, oxidized, masked, etched, doped, metalized, etc., can be required. The steps used, their particular sequence, and the materials involved all contribute to the making of particular devices.

Accordingly, wafer manufacturing facilities are commonly organized to include areas in which chemical vapor deposition, plasma deposition, plasma etching, sputtering and other similar gas manufacturing processes are carried out. The processing tools, such as chemical vapor deposition reactors, vacuum sputtering machines, plasma etchers or plasma enhanced chemical vapor deposition, must be supplied with various process gases. Pure gases must be supplied to the tools in precisely metered quantities.

In a typical wafer manufacturing facility the gases are stored in tanks, which are connected via piping or conduit to a gas box. The gas box delivers precisely metered quantities of pure inert or reactant gases from the tanks of the manufacturing facility to a process tool. The gas box, or gas metering system includes a plurality of gas paths having gas metering units, such as valves, pressure regulators and transducers, mass flow controllers and filters/purifiers. Each gas path has its own inlet for connection to separate sources of gas, but all of the gas paths converge into a single outlet for connection to the process tool.

Sometimes dividing the combined process gases into equal flows, or into unequal but proportional flows, is desired. For example, it may be desirable to divide a single gas flow from a gas box to multiple process chambers, wherein each process chamber receives an equal flow. It may also be desirable to divide a single gas flow from a gas box into separate portions of a single process chamber, wherein each portion of the process chamber receives an equal flow or an unequal but proportional flow.

Various semiconductor manufacturing processes such as low or atmospheric pressure chemical-vapor deposition, etching, epitaxy, utilize a showerhead within a process chamber for evenly distributing process gasses over a semiconductor wafer being processed within the process chamber. The showerhead may comprise a single zone, or may comprise two or more zones. Examples of multi-zone showerheads include, but are not limited to, those shown in U.S. Pat. No. 5,453,124 to Moslehi et al., U.S. Pat. No. 5,624,498 to Lee et al., U.S. Pat. No. 5,976,261 to Moslehi et al., U.S. Pat. No. 6,251,187 to Li et al., U.S. Pat. No. 6,302,964 to Umotoy et al., and U.S. Pat. No. 6,676,760 to Kholodenko et al.

To ensure that the primary flow of the gas box is divided as desired among separate process chambers or separate portions of a single process chamber, flow dividing systems are used. Examples of flow dividing systems include, but are not limited to, those shown in U.S. Pat. No. 4,369,031 to Goldman et al., U.S. Pat. No. 6,333,272 to McMillin et al., U.S. Pat. No. 6,418,954 to Taylor et al., and published U.S. patent application No. 2003/0130807.

What is still desired is a new and improved gas flow dividing system and method that can be used, for example, to divide a single flow of process gases among separate process chambers or separate portions of a single process chamber. Preferably, the flow dividing system and method will incorporate in-situ process (wafer uniformity) monitoring to instantly adjust, if necessary, the flow ratios produced by the flow dividing system and method, and correct semiconductor wafer non-uniformity in real time.

SUMMARY OF THE DISCLOSURE

The present disclosure provides a system for dividing a single mass flow into two or more secondary mass flows of desired ratios. The system includes an inlet for receiving the single mass flow and at least two secondary flow lines connected to the inlet. The system also includes an input device for receiving at least one desired ratio of flow (i.e., a set point), at least one in-situ process monitor providing measurements of products (e.g., thin film measurements of semiconductor wafers) produced by each of the flows lines, and a controller connected to the input device and the in-situ process monitor. The controller is programmed to receive the desired ratio of flow through the input device, receive the product measurements from the in-situ process monitor, and calculate a corrected ratio of flow based upon the desired ratio of flow and the product measurements.

According to one aspect of the present disclosure, the system includes separate process chambers connected to each flow line, and each process chamber includes at least one of the in-situ process monitors for providing measurements of semiconductor wafers within each process chamber.

According to another aspect, the system includes a single process chamber connected to all of the flow lines, and a semiconductor wafer positioned in the process chamber is divided into zones corresponding to the flow lines. According to an additional aspect, the flow lines are connected to a showerhead of the process chamber, and the process chamber includes at least one of the in-situ process monitors for providing measurements of each of the zones of the semiconductor wafer within the process chamber.

Among other aspects and advantages of the present disclosure, the system provides real time corrections for semiconductor wafer processing inconsistencies. The system can divide a single flow of process gases among separate process chambers or among separate portions of a single process chamber, and incorporates in-situ process (wafer uniformity) monitoring to instantly adjust, if necessary, the flow ratios produced by the flow dividing system to correct semiconductor wafer non-uniformity in real time.

According to a further aspect of the present disclosure, the in-situ process monitor comprises a differential sensor. The present disclosure, therefore, utilizes sensors that require only relative calibration and avoids a need for absolute calibration, which is tedious, expensive and often unreliable.

Additional aspects and advantages of the present disclosure will become readily apparent to those skilled in this art from the following detailed description, wherein an exemplary embodiment of the present disclosure is shown and described, simply by way of illustration. As will be realized, the present disclosure is capable of other and different embodiments and its several details are capable of modifications in various obvious respects, all without departing from the disclosure. Accordingly, the drawings and description are to be regarded as illustrative in nature, and not as restrictive.

BRIEF DESCRIPTION OF THE DRAWINGS

Reference is made to the attached drawings, wherein elements having the same reference characters represent like elements throughout, and wherein.

DETAILED DESCRIPTION OF EXEMPLARY EMBODIMENTS

Figure 1:
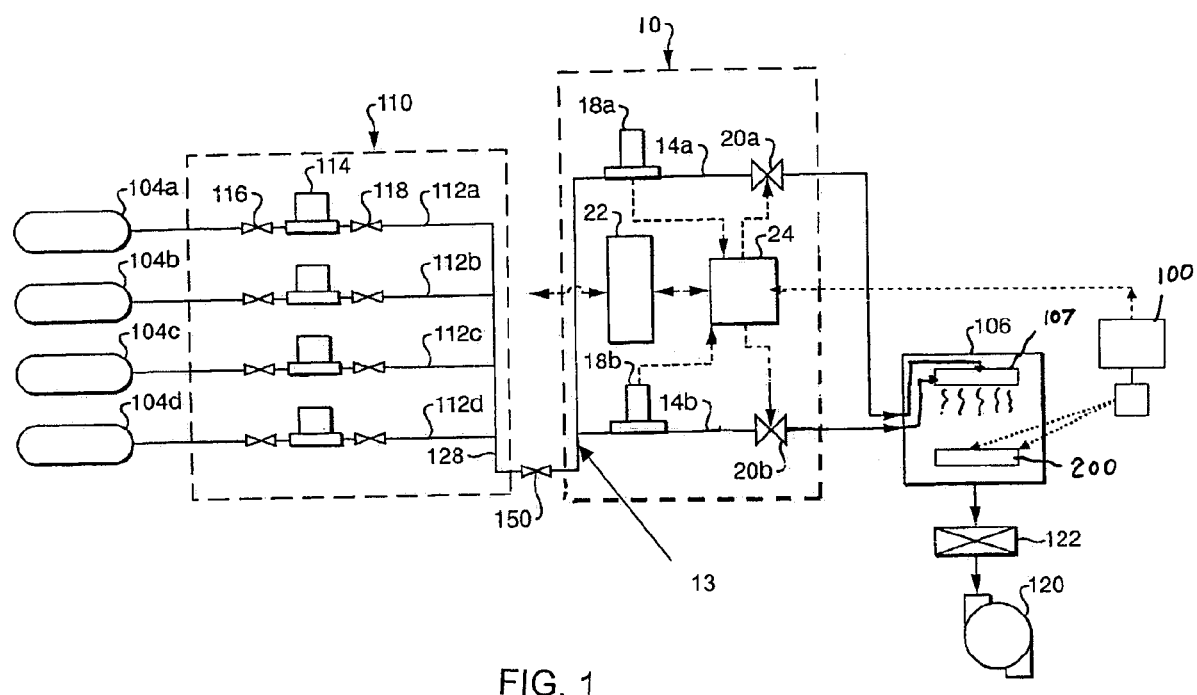
FIG. 1 is a schematic illustration of a flow dividing system constructed in accordance with the present disclosure, and shown connected between a gas metering box and a showerhead of a single process chamber.
Figure 2:
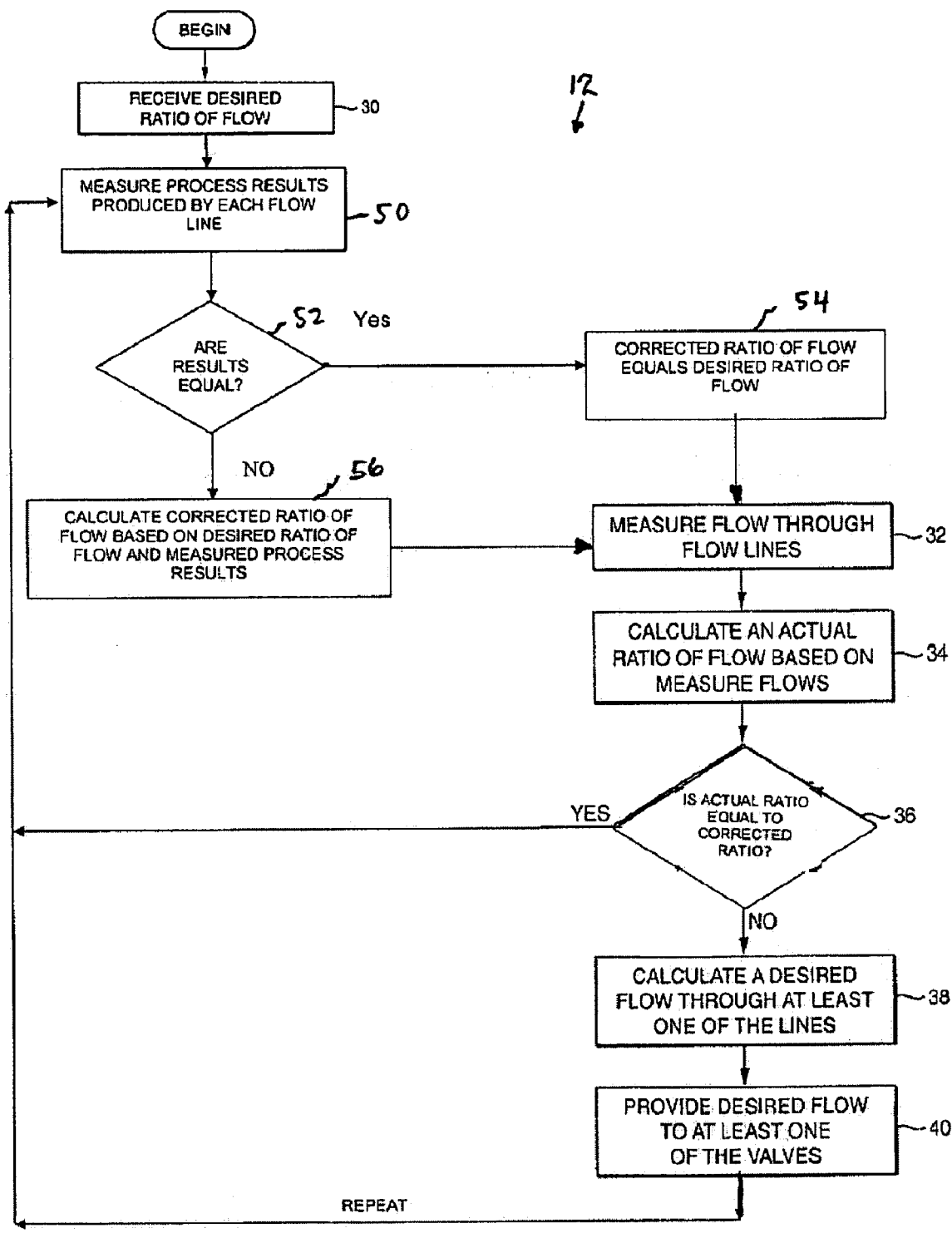
FIG. 2 is a flow chart of a method for dividing flow for the system of FIG. 1.

Referring to FIGS. 1 and 2, the present disclosure provides a flow divider system 10 and method 12 for dividing a single flow of gas (also referred to as mass flow) into a desired ratio of two or more flows. The system 10 and method 12 are particularly intended for use with gas metering systems for delivering contaminant-free, precisely metered quantities of process gases to semiconductor process chambers. The presently disclosed system 10 and method 12 incorporate in-situ process (wafer uniformity) monitoring to instantly adjust, if necessary, the flow ratios to correct semiconductor wafer non-uniformity in real time.

FIG. 1 is a schematic illustration of an exemplary embodiment of the flow dividing system 10 shown connected between an exemplary embodiment of a gas metering box 110 and an exemplary embodiment of a showerhead 107 of a single process chamber 106, which is shown holding a semiconductor wafer 200 for processing. The gas metering box 110 receives multiple gases, including for example both process gases and a purge gas, from gas supplies (e.g., gas tanks) 104a, 104b, 104c, 104d (while four tanks are shown, the system can include more or less than four tanks, as desired), for example, and then combines and precisely meters the gases to the flow dividing system 10.

The gas box 110 has a plurality of gas sticks 112a, 112b, 112c, 112d (while four sticks are shown, the gas box can include more or less than four). Each stick includes, for example, a mass flow controller (MFC) 114, a valve 116 positioned before the MFC and a valve 118 positioned after the MFC. The gas sticks 112a, 112b, 112c, 112d are separately connected to the gas sources 104a, 104b, 104c, 104d and provide controllable gas passageways so that a contaminant-free, precisely metered amount of a gas, or combination of gases, can be supplied from the gas box 110 to the flow divider system 10. Although not shown, the sticks 112a, 112b, 112c, 112d can also each be provided with other components for monitoring or controlling gases, such as filters, purifiers, and pressure transducers and controllers. The sticks 112a, 112b, 112c, 112d connect together, in an outlet manifold 128 for example, to allow the gas flows from each stick to be mixed if desired prior to leaving the gas box.

A vacuum pump 120 is connected to the process chamber 106 through a gate valves 122. During operation, the vacuum pump 120 draws gas from the gas sources 104a, 104b, 104c, 104d, through the gas box 110 and the flow divider system 10 and into the process chamber 106, so that the gases can be used to process the semiconductor wafer 200. The processes carried out by the gases in the process chamber 106 can include, but are not limited to, chemical vapor deposition, plasma deposition, plasma etching, and sputtering. The processes may cause layers of material to be deposited or removed from a top surface of the wafer 200, or may cause properties (e.g., porosity) of the top surface of the wafer 200 to be changed. These changes to the wafer 200 can be monitored to determine the progress of the desired process or processes caused by the gases.

Referring again to FIG. 1, the presently disclosed flow divider system 10 includes an inlet line or manifold 13 for receiving the single gas flow from the outlet manifold 128 of the gas box 110, and first and second flow lines 14a, 14b connected to the inlet 13. Each line 14a, 14b is provided with a mass flow meter 18a, 18b measuring mass flow through the line and providing a signal indicative of the measured flow, and a valve 20a, 20b controlling flow through the line based on a signal indicative of a desired flow rate. The ratio system 10 also has a input device 22 for receiving a desired flow ratio (either directly from a human operator or indirectly through a wafer processing computer controller), and a controller 24 connected to the flow meters 18a, 18b, the valves 20a, 20b and the input device 22. The flow ratio $\alpha$ is defined herein as the flow $Q_2$ through the second line 14b divided by the flow $Q_1$ through the first line 14a.

It should be noted that, although the exemplary embodiment of the flow divider system shown 10 in FIG. 1 includes only two flow lines 14a, 14b, a flow divider system constructed in accordance with the present disclosure can be provide with three or more flow lines.

The flow divider system 10 also includes an in-situ process monitor 100 providing measurements of products produced by each of the flows lines 14a, 14b. The in-situ process monitor 100 may, for example, provide a measurement of the thickness of a layer of film being deposited or removed from the top surface of the wafer 200. The in-situ process monitor 100 may alternatively, for example, provide measurements of properties (e.g., porosity) of the top surface of the wafer 200. The measurements provided by the in-situ process monitor 100 are used to determine the progress of the desired process or processes caused by the gases on the wafer 200 within the process chamber 106.

In-situ process monitors use advanced thin film metrology such as ellipsometry, optical emission spectroscopy (OES) and interferometry to determine properties, such as deposition film thickness of semiconductor wafers. According to one exemplary embodiment, the in-situ process monitor 100 used as part of the system 10 of the present disclosure comprises a differential sensor that obtains measurements by monitoring a ratio of reflected light and emitted light from a light source.

In-situ process monitors are shown, for example, in U.S. Pat. No. 5,387,309 to Bobel et al., U.S. Pat. No. 6,113,733 to Eriguchi et al., U.S. Pat. No. 6,117,348 to Peng et al., U.S. Pat. No. 6,278,809 to Johnson et al., U.S. Pat. No. 6,563,578 to Halliyal et al., and U.S. Pat. No. 6,633,391 to Oluseyi et al., all of which are incorporated herein by reference. In-situ process monitors are presently available, for example, from Jobin Yvon, Inc. of Edison, N.J. (wwwjobinyvon.com), SVT Associates, Inc. of Eden Prairie, Minn. (www.svta.com), Micro Photonics Inc. of Allentown, Pa. (www.microphotonics.com), Luxtron Corporation of Santa Clara, Calif. (www.luxtron.com), and 4Wave, Inc. of Sterling, Va. (www.4waveinc.com).

In the exemplary embodiment of FIG. 1, the flow lines 14a, 14b of the system 10 are both feed into the showerhead 107 of the process chamber 106. The flow $Q_2$ through the second line 14b therefore affects an outer portion or zone of the wafer 200, while the flow $Q_1$ through the first line 14a affects an inner portion or zone of the wafer 200. The inner zone of the wafer 200, therefore, corresponds to the first flow line 14a and the outer zone of the wafer 200 corresponds to the second flow line 14b.

In the exemplary embodiment of FIG. 1, the in-situ process monitor 100 provides at least one measurement $M_1$ from the inner zone of the wafer 200, to indicate the process results of the gas flow through the first flow line 14a. The in-situ process monitor 100 also provides at least one measurement $M_2$ from the outer zone of the wafer 200, to indicate the process results of the gas flow through the second flow line 14b.

Referring now to FIG. 2, the controller 24 is programmed to receive the desired ratio of flow through the input device 22, as shown at 30, receive the signals indicative of measured flow from the flow meters 18a, 18b, as shown at 32, calculate an actual ratio of flow through the flow lines 14a, 14b based upon the measured flow, as shown at 34, and compare the actual ratio to a "corrected" ratio of flow, as shown at 36. The controller 24 is also programmed to calculate the desired flow through at least one of the flow lines 14a, 14b if the actual ratio is unequal to the corrected ratio, as shown at 38, and provide an "adjustment" signal indicative of the desired flow to at least one of the valves 20a, 20b, as shown at 40. The controller 24, therefore, adjusts flow through at least one of the flow lines 14a, 14b until the actual ratio of flow through the lines equals the corrected ratio of flow.

The controller 24 is also programmed to receive the measurements $M_1$ and $M_2$ from the in-situ process monitor 100, as shown at 50 of FIG. 2, and compare the measurements $M_1$ and $M_2$ as shown at 52. If the measurements $M_1$ and $M_2$ are equal, indicating that the flows $Q_1$ and $Q_2$ are producing equal process results on the inner and the out zones of the wafer 200, then the controller 24 is programmed to calculate a corrected ratio of flow equal to the desired ratio of flow, as shown at 54. In other words, no corrections are required since the flows $Q_1$ and $Q_2$ are not producing unequal process results (e.g., unequal film thickness on the inner and the out zones of the wafer 200) and the system 10 is operating as desired.

If the measurements $M_1$ and $M_2$ are not equal, indicating that the flows $Q_1$ and $Q_2$ are not producing equal process results on the inner and the out zones of the wafer 200, then the controller 24 is programmed to calculate a corrected ratio of flow, as shown at 56. First, the controller 24 calculates a process uniformity error $\epsilon_m = k_m/2[(M_1-M_2)/(M_1+M_2)]$, wherein $k_m$ is an arbitrary positive scalar constant, and then calculates the corrected ratio of flow based upon the desired ratio of flow and the process uniformity error $\epsilon_m$. According to one exemplary embodiment, the corrected ratio of flow is equal to the desired ratio of flow multiplied by the process uniformity error $\epsilon_m$. Alternatively, the corrected ratio of flow can be calculated $f(\epsilon_m)$, wherein $f$ is a function that is determined using a model-based approach based upon the actual physical system used.

In one exemplary embodiment, the controller 24 is programmed to provide an "initial" signal to the valve 20a of the first line 14a indicative of a first desired flow, calculate a second desired flow if the actual flow ratio is unequal to the desired flow ratio, and provide an "adjustment" signal to the valve 20b of the second flow line 14b indicative of the second desired flow. The adjustment signal $V_{c2}$ is calculated using the following equation:

$$V_{c2} = K_{pa}(\alpha-\alpha_{sp}) + K_{ia}\int(\alpha-\alpha_{sp})dt$$

Wherein $V_{c2}$ is the command from the controller 24 to the second valve 20b, $K_{pa}$ is a proportional gain for the ratio control, $K_{ia}$ is an integral gain for the ratio control, $\alpha$ is the measured flow ratio, and $\alpha_{sp}$ is the ratio set point or desired flow ratio. In this manner, the valve 20a of the first line 14a acts as a fixed orifice, while the valve 20b of the second line 14b acts as a variable control valve. This feature allows the system 10 to operate independently of the type of gas(es) controlled through the system, since errors in flow measurement due to differing gases are the same for both flow meters 18a, 18b. Preferably, the controller 24 is programmed to cause the valve 20a of the first line 14a to fully open, such that the overall pressure drop across the system 10 is minimized.

Examples of suitable mass flow meters 18a, 18b for use with the ratio system 10 of the present disclosure are thermally based Mass-Flo® brand controllers available from the assignee of the present disclosure, MKS Instruments of Andover, Mass. (http://www.mksinst.com). Suitable valves 20a, 20b are also available from the assignee. The valves 20a, 20b are non-linear and have a narrow controllable range. The thermal flow meters 18a, 18b, however, are the limiting factor in determining a control range provided by the system 10, since the flow meters are not normally reliable below five percent of the maximum sensor range (e.g., a 2,000 sccm thermal flow meter is not reliable below 100 sccm).

Although not shown, the mass flow ratio system 10 can be provided with more than two flow lines 14, with each additional flow line having a valve 20 and a flow meter 18 connected to the controller 24. In addition, it is envisioned that a mass flow controller can be used as the mass flow meter and the valve of each line. Although not shown, it is envisioned that the disclosed ratio system 10 can be provided as a modular unit for quick and easy assembly between a gas box and a process chamber(s). In such a case, a shut-off valve or suitable connector 150 might be provided between the inlet manifold 13 of the ratio system 10 and the outlet manifold 128 of the gas box 110, as shown in FIG. 1.

Embodiments of a system and a method for dividing flow according to the present invention can further include a pressure sensor for the inlet 13 and/or outlets of the system 10. The inlet pressure and/or the outlet pressure measurement provided by the pressure sensor(s) is used by the controller 24 to not only control the ratio α of the flows, but also control the inlet pressure and/or the outlet pressures.

Adding a pressure control feature has a number of ancillary benefits, including improving the system 10 performance and reducing disturbances to devices upstream or downstream of the system 10. By operating the system 10 at the maximum allowable pressures, the need for factors of safety in the ratio control system can be removed or reduced. In addition, controlling the pressure drop across the valves 20a, 20b improves valve performance and makes valve setup, matching, and tuning more simple. The present disclosure is intended, therefore, to include a system and a method for dividing flow, with any added pressure control features. For example, the present disclosure is intended to include the flow divider system 10 plus a pressure sensor(s) in the inlet and/or the outlets of the system. The present disclosure is also intended to include a method 12 of dividing flow plus measuring pressure(s) in the inlet and/or the outlets. In effect, the present application is meant to include any control methodologies using pressure measurements for the claimed flow dividing system and method.

The following example is made with reference to FIG. 1. Assuming the addition of a pressure sensor (not shown) on the inlet 13 of the mass flow ratio system 10, the controller 24 is programmed to take three inputs: the flow $Q_2$ through the second line 14b; the flow $Q_1$ through the first line 14a; and a measured pressure $P_{in}$ at the inlet 13 as provided by the pressure sensor. The controller 24 is programmed to issue commands to both of the first and the second valves 20a, 20b dynamically, instead of just controlling one valve at a time. However, in terms of ratio control, the "fixed valve" is mostly open, while the ratio is determined by controlling the other valve between 10% and 50% of a control range of the valve. With the addition of the pressure signal the fixed valve is set to control the inlet pressure, and the other valve is used to control the flow ratio.

An example of an inlet pressure control could be written as:

$$V_{c1} = K_{pp}(P_{in}-P_t) + K_{ip}\int (P_{in}-P_t)dt$$

$$V_{c2} = K_{p\alpha}(\alpha-\alpha_{sp}) + K_{i\alpha}\int (\alpha-\alpha_{sp})dt$$

Wherein $V_{c1}$ is the command from the controller 24 to the first valve 20a, and $V_{c2}$ is the command to the second valve 20b, $K_{pp}$ is a proportional gain for pressure control, $K_{ip}$ is an integral gain for the pressure control, $K_{p\alpha}$ is a proportional gain for the ratio control, $K_{i\alpha}$ is an integral gain for the ratio control, $\alpha$ is the measured flow ratio, $\alpha_{sp}$ is the ratio set point or desired flow ratio, $P_{in}$ is the measured inlet pressure, and $P_t$ is an operating pressure threshold (or a desired pressure).

While the control system and method is described as a proportional-plus-integral (PI) type control system and method, it should be appreciated that other types of control systems and methods can be used, such as proportional, integral, proportional-plus-derivative (PD), and proportional-plus-integral-plus-derivative (PID) types of control systems and methods.

Figure 3:
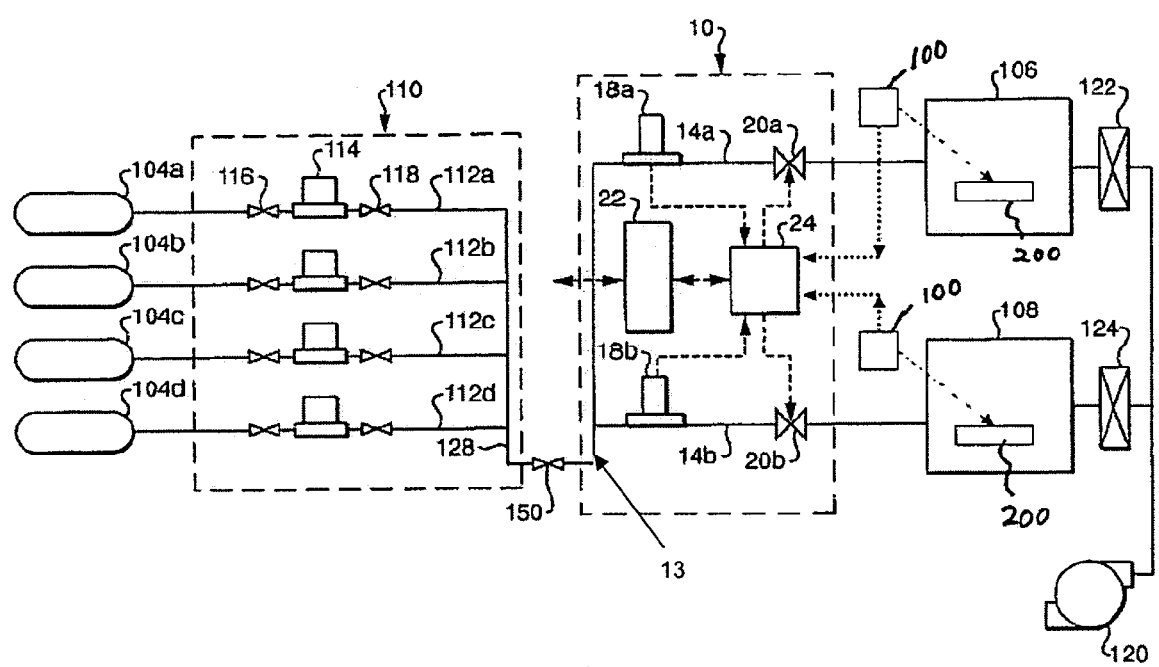
FIG. 3 is a schematic illustration of the flow divider system of FIG. 1 shown connected between a gas metering box and two process chambers.

In FIG. 3, the system 10 includes separate process chambers 106, 108 connected to each flow line 14a, 14b, respectively, and each process chamber 106, 108 includes at least one of the in-situ process monitors 100 for providing measurements of semiconductor wafers 200 within each process chamber.

Among other aspects and advantages of the present disclosure, the system 10 provides real time corrections for semiconductor wafer processing inconsistencies. The system 10 can divide a single flow of process gases among separate process chambers 106, 108 or among separate portions of a single process chamber 106, and incorporates in-situ process (wafer uniformity) monitoring to instantly adjust, if necessary, the flow ratios produced by the flow dividing system 10 to correct semiconductor wafer non-uniformity in real time. Since the in-situ process monitor 100 comprises a differential sensor, in-situ process monitor requires only relative calibration and avoids a need for absolute calibration, which is tedious, expensive and often unreliable.

The exemplary embodiments described in this specification have been presented by way of illustration rather than limitation, and various modifications, combinations and substitutions may be effected by those skilled in the art without departure either in spirit or scope from this disclosure in its broader aspects and as set forth in the appended claims.

What is claimed is:

1. A system for dividing a single flow into two or more secondary flows of desired ratios, comprising:
   an inlet adapted to receive the single flow;
   at least two secondary flow lines connected to the inlet;
   an input device adapted to receive at least one desired ratio of flow;
   at least one in-situ process monitor providing measurements of products produced by each of the flows lines; and
   a controller connected to the input device and the in-situ process monitor and programmed to,
     receive the desired ratio of flow through the input device,
     receive the product measurements from the in-situ process monitor,
     calculate a corrected ratio of flow based upon the desired ratio of flow and the product measurements.

2. A system according to claim 1, further comprising separate process chambers connected to each flow line.

3. A system according to claim 2, wherein each process chamber includes at least one of the in-situ process monitors for providing measurements of semiconductor wafers within each process chamber.

4. A system according to claim 3, wherein the measurements provided by the in-situ process monitors comprise film thickness measurements of each wafer.

5. A system according to claim 1, further comprising a single process chamber connected to all of the flow lines, and a semiconductor wafer positioned in the process chamber is divided into zones corresponding to the flow lines.

6. A system according to claim 5, wherein the flow lines are connected to a showerhead of the process chamber.

7. A system according to claim 5, wherein the process chamber includes at least one of the in-situ process monitors for providing measurements of each of the zones of the semiconductor wafer within the process chamber.

8. A system according to claim 7, wherein the measurements provided by the in-situ process monitor comprise film thickness measurements of each zone.

9. A system according to claim 1, wherein the system comprises two flow lines, the in-situ process monitor provides two of the measurements $M_1$ and $M_2$, and the controller is programmed to calculate a process uniformity error $\epsilon_m = k_m/2[(M_1-M_2)/(M_1+M_2)]$, wherein $k_m$ is an arbitrary positive scalar constant, and then calculate the corrected ratio of flow based upon the desired ratio of flow and the process uniformity error $\epsilon_m$.

10. A system according to claim 1, wherein the corrected ratio of flow is equal to the desired ratio of flow multiplied by the process uniformity error $\epsilon_m$.

11. A system according to claim 1, wherein the in-situ process monitor is a differential sensor.

12. A system according to claim 11, wherein the in-situ process monitor obtains measurements by monitoring a ratio of reflected light and emitted light from a light source.

13. A system according to claim 1, wherein each flow line includes a flow meter measuring flow through the flow line, and a valve controlling flow through the flow line, and wherein the controller receives measured flows from the flow meters, calculate an actual ratio of flow through the flow lines based upon the measured flows, compares the actual ratio to the corrected ratio of flow, calculates a desired flow through at least one of the flow lines if the actual ratio is unequal to the compensated desired ratio, and provides the desired flow to at least one of the valves.

14. A system according to claim 13, wherein the desired flow is substantially equal to $K_p(\alpha-\alpha_{sp})+K_i\int(\alpha-\alpha_{sp})dt$, wherein $K_p$ is a proportional gain, $K_i$ is an integral gain, $\alpha$ is the actual flow ratio, and $\alpha_{sp}$ is the corrected flow ratio.

15. A system according to claim 13, further comprising a pressure sensor measuring pressure in the inlet.

16. A system according to claim 15, wherein the controller is programmed to provide a signal indicative of the desired flow to the valve of the first flow line substantially equal to $K_{p\alpha}(\alpha-\alpha_{sp})+K_{i\alpha}\int(\alpha-\alpha_{sp})dt$, wherein $K_{p\alpha}$ is a proportional gain for ratio control, $K_{i\alpha}$ is an integral gain for ratio control, $\alpha$ is the actual flow ratio, and $\alpha_{sp}$ is the corrected flow ratio.

17. A system according to claim 16, wherein the controller is programmed to provide a signal indicative of the desired flow to the valve of the second flow line substantially equal to $K_{pp}(P_{in}-P_t)+K_{ip}\int(P_{in}-P_t)dt$, wherein $K_{pp}$ is a proportional gain for pressure control, $K_{ip}$ is an integral gain for pressure control, $P_{in}$ is the measured inlet pressure, and $P_t$ is an operating pressure threshold.

18. A method for dividing a single flow into two or more secondary flows of desired ratios, comprising:
 dividing a single flow into at least two flow lines;
 measuring flow through each flow line;
 receiving at least one desired ratio of flow;
 measuring products produced by each of the flows lines in-situ;
 calculating a corrected ratio of flow based upon the desired ratio of flow and the product measurements;
 calculating an actual ratio of mass flow through the flow lines based upon the measured flows;
 calculating a desired flow through at least one of the flow lines if the actual ratio does not equal the corrected ratio; and
 regulating the flow line to the desired flow.

19. A method according to claim 18, wherein:
 the single mass flow is divided into first and second flow lines;
 the first flow line is regulated to a first desired flow;
 a second desired flow is calculated using the desired ratio and the first desired flow if the actual ratio is unequal to the corrected ratio; and
 the second flow line is regulated to the second desired flow.

20. A method according to claim 19, wherein the first desired flow causes the first line to be fully open.

21. A method according to claim 18, wherein the desired flow is substantially equal to $K_p(\alpha-\alpha_{sp})+K_i\int(\alpha-\alpha_{sp})dt$, wherein $K_p$ is a proportional gain, $K_i$ is an integral gain, $\alpha$ is the actual flow ratio, and $\alpha_{sp}$ is the corrected flow ratio.

22. A method according to claim 18, further comprising measuring pressure in the inlets.

23. A method according to claim 22, wherein the desired flow in one of the flow lines is substantially equal to $K_{p\alpha}(\alpha-\alpha_{sp})+K_{i\alpha}\int(\alpha-\alpha_{sp})dt$, wherein $K_{p\alpha}$ is a proportional gain for ratio control, $K_{i\alpha}$ is an integral gain for ratio control, $\alpha$ is the actual flow ratio, and $\alpha_{sp}$ is the corrected flow ratio.

24. A method according to claim 22, wherein the desired flow in one of the flow lines is substantially equal to $K_{pp}(P_{in}-P_t)+K_{ip}\int(P_{in}-P_t)dt$, wherein $K_{pp}$ is a proportional gain for pressure control, $K_{ip}$ is an integral gain for pressure control, $P_{in}$ is the measured inlet pressure, and $P_t$ is an operating pressure threshold.

25. A method according to claim 18, further comprising connecting each flow lines to a separate process chamber.

26. A method according to claim 18, further comprising connecting a single process chamber to all of the flow lines.

27. A method according to claim 26, wherein the flow lines are connected to a showerhead of the process chamber.

28. A method according to claim 18, wherein the corrected ratio of flow is based upon the desired ratio of flow and a process uniformity error $\epsilon_m=k_m/2[(M_1-M_2)/(M_1+M_2)]$, wherein $k_m$ is an arbitrary positive scalar constant, and $M_1$ and $M_2$ are the in-situ measurements of products produced by each flow line.

29. A method according to claim 28, wherein the corrected ratio of flow is equal to the desired ratio of flow multiplied by the process uniformity error $\epsilon_m$.

30. A method according to claim 18, wherein the in-situ measurements of products comprise differential measurements.

31. A method according to claim 18, wherein the in-situ measurements of products are obtained by monitoring a ratio of reflected light and emitted light from a light source.

* * * * *